United States Patent
Ookura et al.

(10) Patent No.: US 12,122,885 B2
(45) Date of Patent: Oct. 22, 2024

(54) RESIN PARTICLES, ELECTRICALLY CONDUCTIVE PARTICLES, ELECTRICALLY CONDUCTIVE MATERIAL, AND CONNECTION STRUCTURE

(71) Applicant: SEKISUI CHEMICAL CO., LTD., Osaka (JP)

(72) Inventors: Kouki Ookura, Osaka (JP); Takeshi Wakiya, Osaka (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 17/911,505

(22) PCT Filed: Mar. 26, 2021

(86) PCT No.: PCT/JP2021/012831
§ 371 (c)(1),
(2) Date: Sep. 14, 2022

(87) PCT Pub. No.: WO2021/193911
PCT Pub. Date: Sep. 30, 2021

(65) Prior Publication Data
US 2023/0106977 A1    Apr. 6, 2023

(30) Foreign Application Priority Data

Mar. 26, 2020    (JP) ................ 2020-056497

(51) Int. Cl.
| | | |
|---|---|---|
| C08J 3/12 | (2006.01) | |
| C08F 20/14 | (2006.01) | |
| C08F 22/40 | (2006.01) | |
| C08K 3/08 | (2006.01) | |
| C08K 9/10 | (2006.01) | |
| C08L 71/12 | (2006.01) | |
| C23C 18/16 | (2006.01) | |
| C23C 18/32 | (2006.01) | |
| G02F 1/1339 | (2006.01) | |
| H01B 1/22 | (2006.01) | |
| H01L 23/00 | (2006.01) | |
| H01R 4/04 | (2006.01) | |

(52) U.S. Cl.
CPC ............. *C08J 3/128* (2013.01); *C08F 20/14* (2013.01); *C08F 22/40* (2013.01); *C08K 3/08* (2013.01); *C08K 9/10* (2013.01); *C08L 71/123* (2013.01); *C23C 18/1641* (2013.01); *C23C 18/32* (2013.01); *G02F 1/13398* (2021.01); *H01B 1/22* (2013.01); *H01L 24/29* (2013.01); *H01R 4/04* (2013.01); *C08J 2379/08* (2013.01); *C08K 2003/0862* (2013.01); *C08K 2201/005* (2013.01); *C08L 2205/03* (2013.01); *G02F 2202/022* (2013.01); *H01L 2224/2929* (2013.01); *H01L 2224/29311* (2013.01); *H01L 2224/29339* (2013.01); *H01L 2224/29344* (2013.01); *H01L 2224/29347* (2013.01); *H01L 2224/29355* (2013.01); *H01L 2224/29364* (2013.01); *H01L 2224/2939* (2013.01); *H01L 2924/061* (2013.01); *H01L 2924/0615* (2013.01); *H01L 2924/0635* (2013.01); *H01L 2924/0665* (2013.01); *H01L 2924/0675* (2013.01); *H01L 2924/069* (2013.01); *H01L 2924/07025* (2013.01)

(58) Field of Classification Search
None
See application file for complete search history.

(56) References Cited

U.S. PATENT DOCUMENTS

| | | | |
|---|---|---|---|
| 2015/0210884 A1* | 7/2015 | Hayashi | ............... C08L 63/00 524/611 |
| 2016/0327826 A1 | 11/2016 | Shinohara | |
| 2017/0309590 A1 | 10/2017 | Tsukao | |
| 2021/0054197 A1 | 2/2021 | Umehara et al. | |

FOREIGN PATENT DOCUMENTS

| | | |
|---|---|---|
| CN | 107615403 | 1/2018 |
| CN | 110603272 | 12/2019 |
| JP | 07-124866 | 5/1995 |
| JP | 2001-220691 | 8/2001 |
| JP | 2006-249380 | 9/2006 |
| JP | 2008-222879 | 9/2008 |
| JP | 2010-248470 | 11/2010 |
| JP | 2012-064559 | 3/2012 |
| JP | 2012-193325 | 10/2012 |
| JP | 2013-149966 | 8/2013 |
| JP | 2014-1289 | 1/2014 |
| JP | 2014-143188 | 8/2014 |
| JP | 2015-193725 | 11/2015 |
| JP | 2016-41803 | 3/2016 |
| JP | 2017-63033 | 3/2017 |
| JP | 2017-171724 | 9/2017 |
| JP | 2018-48309 | 3/2018 |
| JP | 2018-119023 | 8/2018 |
| JP | 2019-114552 | 7/2019 |

(Continued)

OTHER PUBLICATIONS

English translation of Harada et al. (WO 2017/171087). (Year: 2017).*

(Continued)

*Primary Examiner* — Ronak C Patel
(74) *Attorney, Agent, or Firm* — Wenderoth, Lind & Ponack, L.L.P.

(57) ABSTRACT

The present invention aims to provide resin particles that have excellent heat resistance and that, when used as base particles of conductive particles, are applicable to mounting by thermocompression bonding at low pressure to produce a connection structure having excellent connection reliability. The present invention also aims to provide conductive particles, a conductive material, and a connection structure each including the resin particles. Provided are resin particles having a 5% weight loss temperature of 350° C. or higher, a 10% K value at 25° C. of 100 N/mm² or more and 2,500 N/mm² or less, and a 30% K value at 25° C. of 100 N/mm² or more and 1,500 N/mm² or less.

10 Claims, No Drawings

(56) References Cited

FOREIGN PATENT DOCUMENTS

| JP | 2019-140116 | 8/2019 |
| WO | 2009/034940 | 3/2009 |
| WO | 2011/158783 | 12/2011 |
| WO | 2017/051842 | 3/2017 |
| WO | 2019/188185 | 10/2019 |

OTHER PUBLICATIONS

English translation of Jun et al. (KR 2006/0093503) (Year: 2006).*
English translation of Takahashi et al. (JP 2018/165359) (Year: 2018).*
International Search Report issued May 11, 2021 in International PCT Application No. PCT/JP2021/012831.
Katsuya Asao, "Research on design of functional polyimide particles and their application", Doctoral Dissertation, Osaka Prefecture University, Feb. 2013, pp. 1-170, with English translation.

* cited by examiner

RESIN PARTICLES, ELECTRICALLY CONDUCTIVE PARTICLES, ELECTRICALLY CONDUCTIVE MATERIAL, AND CONNECTION STRUCTURE

TECHNICAL FIELD

The present invention relates to resin particles that have excellent heat resistance and that, when used as base particles of conductive particles, are applicable to mounting by thermocompression bonding at low pressure to produce a connection structure having excellent connection reliability. The present invention also relates to conductive particles, a conductive material, and a connection structure each including the resin particles.

BACKGROUND ART

To provide conductive connections between electrodes of electronic circuit boards or the like, methods have been proposed that use conductive particles having a conductive layer on the surface of base particles such as resin particles (e.g., Patent Literature 1). Such conductive particles are used for IC chips and liquid crystal display elements, for example.

Conventional conductive particles may provide high connection resistance between electrodes when a relatively low pressure is used to electrically connect the electrodes. This is because at such a relatively low pressure, conductive particles do not sufficiently deform and are less likely to make sufficient contact with electrodes. Conventional conductive particles, therefore, require a relatively high pressure for sufficient deformation.

However, although using a relatively high pressure to electrically connect electrodes can deform base particles or conductive particles, it may cause scratches on the electrodes, leading to high connection resistance. In addition, the compressed base particles or conductive particles may try to return to their original shape and cause a phenomenon called spring-back. Spring-back of base particles or conductive particles may reduce the contact area between the conductive particles and the electrodes, leading to higher connection resistance and lower continuity reliability.

In recent years, various IC chips have been used around the engines or the motor drive units of automobiles and the like. These are severe environments where IC chips are exposed to high temperature repeatedly for a long time, unlike IC chips used for conventional electronic devices. The components constituting IC chips are thus required to have long-term reliability at high temperature, and base particles of conductive particles are required to have excellent heat resistance.

Many recent liquid crystal display elements include flexible circuit boards, as the bezels are becoming slimmer and the liquid crystal display elements are becoming thinner. For example, in the process of producing a liquid crystal display element, a flexible circuit board is mounted by the FOG method. Specifically, a conductive material containing conductive particles is disposed on a glass substrate, then a flexible circuit board is stacked thereon, followed by thermocompression bonding. In such FOG mounting of a flexible circuit board, thermocompression bonding at high pressure may cause distortion after mounting, leading to display unevenness in the resulting liquid crystal display element. There is thus a demand for base particles of conductive particles that have flexibility to be applicable to mounting by thermocompression bonding at low pressure.

Known resin particles having excellent heat resistance include, for example, divinylbenzene crosslinked particles. However, since these particles are hard, it is difficult to apply these particles to mounting by thermocompression bonding at low pressure when they are used as base particles of conductive particles in low-pressure mounting such as the FOG method.

Other known resin particles having excellent heat resistance include polyimide particles. For example, Patent Literature 2 discloses a method of producing polyimide particles. The production method disclosed in Patent Literature 2, however, has difficulty in producing perfectly spherical polyimide particles with good reproducibility. This complicates the plating step that is needed for particles used as base particles of conductive particles. Patent Literature 3 also discloses a similar method of producing polyimide particles. The particles produced by this method are in the order of several hundred nanometer, which have too small a particle size to use as conductive particles.

CITATION LIST

Patent Literature

Patent Literature 1: JP 2001-220691 A
Patent Literature 2: JP 2008-222879 A
Patent Literature 3: JP 2006-249380 A Non-Patent Literature Non-Patent Literature 1: Katsuya Asao, "Preparation and functionalities in BiFeO_3 based dielectric oxides", 2013, doctoral dissertation, Osaka Prefecture University, [searched on Mar. 22, 2021], online <URL: http://hdl.handle.net/10466/13840>

SUMMARY OF INVENTION

Technical Problem

The present invention aims to provide resin particles that have excellent heat resistance and that, when used as base particles of conductive particles, are applicable to mounting by thermocompression bonding at low pressure to produce a connection structure having excellent connection reliability. The present invention also aims to provide conductive particles, a conductive material, and a connection structure each including the resin particles.

Solution to Problem

The present invention relates to resin particles having a 5% weight loss temperature of 350° C. or higher, a 10% K value at 25° C. of 100 N/mm$^2$ or more and 2,500 N/mm$^2$ or less, and a 30% K value at 25° C. of 100 N/mm$^2$ or more and 1,500 N/mm$^2$ or less.

The present invention is described in detail below.

The present inventors have arrived at resin particles that have a 5% weight loss temperature of not lower than a specific temperature and that have a 10% K value and 30% K value in the respective specific ranges. The inventors found out that such particles have excellent heat resistance and, when used as base particles of conductive particles, are applicable to mounting by thermocompression bonding at low pressure to produce a connection structure having excellent connection reliability. The inventors thus completed the present invention.

The lower limit of the 5% weight loss temperature of the resin particles of the present invention is 350° C. With a 5% weight loss temperature of 350° C. or higher, the resin particles of the present invention can have excellent heat resistance and are suitable for applications in high-temperature environments such as in-vehicle applications. The lower limit of the 5% weight loss temperature is preferably 360° C., more preferably 380° C., still more preferably 400° C.

There is no particular preferred upper limit for the 5% weight loss temperature, but the upper limit is practically 600° C.

The 5% weight loss temperature can be determined as the temperature at which the weight loss reaches 5% in thermogravimetric analysis performed using a thermogravimetry-differential thermal analyzer in a nitrogen atmosphere under the heating conditions of a heating rate of 5° C./min from 35° C. to 1,000° C. The thermogravimetry-differential thermal analyzer may be TG/DTA6300 (produced by Hitachi High-Tech Science Corporation), for example.

The lower limit of the 10% K value at 25° C. of the resin particles of the present invention is 100 N/mm$^2$, and the upper limit thereof is 2,500 N/mm$^2$. With a 10% K value of 100 N/mm$^2$ or more, the resin particles can maintain a uniform gap when used as base particles of conductive particles for a connection structure. This allows the resulting connection structure to have excellent reliability. With a 10% K value of 2,500 N/mm$^2$ or less, the resin particles are suitably applicable to mounting by thermocompression bonding at low pressure when used as base particles of conductive particles. The lower limit of the 10% K value is preferably 150 N/mm$^2$, more preferably 320 N/mm$^2$, still more preferably 400 N/mm$^2$, and the upper limit thereof is preferably 2,000 N/mm$^2$, more preferably 1,900 N/mm$^2$, still more preferably 1,500 N/mm$^2$.

The 10% K value above and the 30% K value described later can be determined as follows. A resin particle is compressed with a flat-end, cylindrical diamond indenter with a diameter of 50 μm under the conditions of 25° C., a compression rate of 0.3 mN/sec, and a maximum test load of 10 mN using a compression tester, to measure the compression displacement (μm). The K values can be determined using the following equation. The compression tester may be FISCHERSCOPE H-100 (produced by Fischer Instruments K.K.), for example.

$$K \text{ value } (N/mm^2) = (3/\sqrt{2}) \cdot F \cdot S^{-3/2} \cdot R^{-1/2}$$

In the equation, F is the load value (N) when the particle is compressively deformed 10% or 30%, S is the compression displacement (mm) when the particle is compressively deformed 10% or 30%, and R is the radius (mm) along the minor axis of the particle.

The lower limit of the 30% K value at 25° C. of the resin particles of the present invention is 100 N/mm$^2$, and the upper limit thereof is 1,500 N/mm$^2$. With a 30% K value of 100 N/mm$^2$ or more, the resin particles can maintain a uniform gap when used as base particles of conductive particles for a connection structure. This allows the resulting connection structure to have excellent reliability. With a 30% K value of 1,500 N/mm$^2$ or less, the resin particles can suitably accommodate mounting by thermocompression bonding at low pressure when used as base particles of conductive particles. The lower limit of the 30% K value is preferably 150 N/mm$^2$, more preferably 200 N/mm$^2$, still more preferably 240 N/mm$^2$, and the upper limit thereof is preferably 900 N/mm$^2$, more preferably 720 N/mm$^2$, still more preferably 700 N/mm$^2$.

The upper limit of the coefficient of variation of the aspect ratio of the resin particles of the present invention is preferably 10%. Resin particles having a coefficient of variation of the aspect ratio of 10% or less can maintain a more uniform gap when used as base particles of conductive particles, so that short circuits in the horizontal direction between electrodes can be avoided. This allows the resulting connection structure to have better reliability. The upper limit of the coefficient of variation of the aspect ratio is more preferably 3%, still more preferably 2%, particularly preferably 1%.

There is no particular preferred lower limit for the coefficient of variation of the aspect ratio, but the lower limit is practically 0.1%.

The coefficient of variation of the aspect ratio can be determined as follows. Images of the particles are captured with a scanning electron microscope. The major and minor axes of 50 particles in the images are each measured with a caliper to determine the aspect ratio. From the standard deviation and the average of the aspect ratio, the coefficient of variation can be determined using the following equation. The scanning electron microscope may be Regulus-8220 (produced by Hitachi High-Technologies Corporation), for example.

$$\text{Coefficient of variation of aspect ratio } (\%) = (\sigma a/\Sigma a) \times 100$$

In the equation, σa is the standard deviation of the aspect ratio, and Σa is the average aspect ratio.

The lower limit of the average particle size of the resin particles of the present invention is preferably 0.1 μm, and the upper limit thereof is preferably 1,000 μm. Resin particles having an average particle size of 0.1 μm or greater form fewer aggregated conductive particles when a conductive layer is formed. An average particle size of 1,000 μm or smaller results in a sufficiently large contact area between the conductive particles and electrodes when the conductive particles are used to connect electrodes. Too large an average particle size hinders sufficient compression of the conductive particles, which may result in high connection resistance value between electrodes. The lower limit of the average particle size is more preferably 1.0 μm, and the upper limit thereof is more preferably 500 μm.

The average particle size is a number average particle size. It can be determined as follows. Images of the particles are captured with a scanning electron microscope. The minor axes of 50 particles in the obtained images are each measured with a caliper, and the average thereof is determined as the average particle size.

The upper limit of the coefficient of variation of the particle size of the resin particles of the present invention is preferably 20% as determined by particle size distribution measurement. Resin particles having a coefficient of variation of the particle size of 20% or less can maintain a more uniform gap when used as base particles of conductive particles used for a connection structure. This allows the resulting connection structure to have better reliability. The upper limit of the coefficient of variation of the particle size is more preferably 11%, still more preferably 10%.

There is no particular preferred lower limit for the coefficient of variation of the particle size, the lower limit is practically 0.1%.

The coefficient of variation of the particle size can be determined as follows. Using a laser diffraction scattering-type particle size distribution analyzer, the standard deviation and the average of the particle size are determined. The coefficient of variation of the particle size can be determined using the following equation. The particle size distribution analyzer may be LS 13 320 (wet system) (produced by Beckman Coulter, Inc), for example.

Coefficient of variation of particle size (%)=($\sigma s/\Sigma s$)×100

In the equation, $\sigma s$ is the standard deviation of the particle size, and $\Sigma s$ is the average particle size.

The upper limit of a change in the 30% K value of the resin particles of the present invention before and after heating at 200° C. for 24 hours is preferably 200%. When the change in the 30% K value before and after heating is 200% or less, the resin particles used as base particles of conductive particles can reduce the damage to the conductive layer and to a surface of circuit board or substrate caused by hardening of the particles during use under high temperature. The upper limit of the change in the 30% K value before and after heating is more preferably 140%, still more preferably 120%, particularly preferably 90%.

There is no particular preferred lower limit for the change in the 30% K value before and after heating, but the lower limit is practically 0%. When the change in the 30% K value before and after heating is not more than the lower limit, particle deterioration is expected, which causes concern for weakening of electrode portions, decreasing the continuity reliability of the connection structure.

The change in the 30% K value before and after heating can be determined using the following equation.

Change (%) in 30% $K$ value before and after heating=($B$−$A$)/$A$×100

In the equation, A is the 30% K value at 25° C. before heating, and B is the 30% K value at 25° C. after heating at 200° C. for 24 hours.

When used as base particles of conductive particles, the resin particles of the present invention preferably have a recovery rate of 2.5% or more and 25% or less. Resin particles having a recovery rate of 2.5% or more can effectively increase the continuity reliability between electrodes. Resin particles having a recovery rate of 25% or less can effectively reduce the occurrence of spring-back in mounting at low pressure, reducing a decrease in continuity reliability of the connection structure. The lower limit of the recovery rate is more preferably 3.5%, and the upper limit thereof is more preferably 21%.

The recovery rate is L2/L1 expressed in percentage, where L1 is a compressive displacement when a load is applied from the initial load to a predetermined reverse load, and L2 is an unloading displacement when the load is released from the reverse load to the initial load. Specifically, a resin particle is loaded with a flat-end, cylindrical diamond indenter with a diameter of 50 μm under the conditions of 25° C., a compression rate of 0.3 mN/sec, an initial load of 1.0 mN, and a reverse load of 10 mN using a compression tester. The recovery behavior after unloading is analyzed to determine the recovery rate.

Recovery rate (%)=[$L2/L1$]×100

The 5% weight loss temperature, the 10% K value at 25° C., and the 30% K value at 25° C. of the resin particles of the present invention can be easily adjusted to the above ranges by selecting the materials constituting the resin particles.

The resin particles of the present invention preferably have a backbone containing an imide group. Specific examples thereof include resin particles constituted by polybismaleimide, a copolymer of bismaleimide and a compound having an unsaturated double bond, polyimide, or the like.

In particular, the resin particles of the present invention preferably have a bismaleimide-derived segment. A polymer having the bismaleimide-derived segment, in other words, a polymer obtained using bismaleimide as a polymerizable monomer, makes it easier to adjust the 5% weight loss temperature, the 10% K value at 25° C., and the 30% K value at 25° C. to the above ranges.

Specific examples of the bismaleimide include compounds represented by the formula (1) below, compounds represented by the formula (2) below, compounds represented by the formula (3) below, BMI-1700 (produced by Designer Molecules Inc.), BMI-2500 (produced by Designer Molecules Inc.), BMI-3000 (produced by Designer Molecules Inc.), BMI-5000 (produced by Designer Molecules Inc.), BMI-6000 (produced by Designer Molecules Inc.), 1,2-bis(maleimide)ethane, 1,4-bis(maleimide)butane, 4,4'-bismaleimidediphenylmethane, 4,4'-diphenylmethane bismaleimide, bis-(3-ethyl-4-maleimidephenyl)methane, 2,2'-bis-[4-(4-maleimidephenoxy)phenyl]propane, 4,4'-diphenylmethane bismaleimide, 1,4-phenylene bismaleimide, 1,3-phenylene bismaleimide, bisphenol A diphenyl ether bismaleimide, 3,3'-dimethyl-5,5'-diethyl-4,4'-diphenylmethane bismaleimide, 4-methyl-1,3-phenylene bismaleimide, 1,6'-bismaleimide-(2,2,4-trimethyl)hexane, 4,4'-diphenyl ether bismaleimide, 4,4'-diphenyl sulfone bismaleimide, 1,3-bis(3-maleimidephenoxy)benzene, 1,3-bis(4-maleimidephenoxy)benzene, 1-maleimide maleimidemethyl-3,5,5-trimethylcyclohexane, 1,1'-(cyclohexane-1,3-diylbis(methylene))bis(1H-pyrrole-2,5-dione), 1,1'-(4,4'-methylenebis(cyclohexane-4,1-diyl))bis(1H-pyrrole-2,5-dione), 1,1'-(3,3'-(piperazine-1,4-diyl)bis(propane-3,1-diyl))bis(1H-pyrrole-2,5-dione), and 2,2'-(ethylenedioxy)bis(ethylmaleimide). Preferred among these are compounds represented by the formula (1) below, compounds represented by the formula (2) below, and compounds represented by the formula (3) below.

Examples of commercially available compounds represented by the formula (1) below include BMI-689 (produced by Designer Molecules Inc.).

Examples of commercially available compounds represented by the formula (2) below include BMI-1400 (produced by Designer Molecules Inc.).

Examples of commercially available compounds represented by the formula (3) below include BMI-1500 (produced by Designer Molecules Inc.).

[Chem. 1]

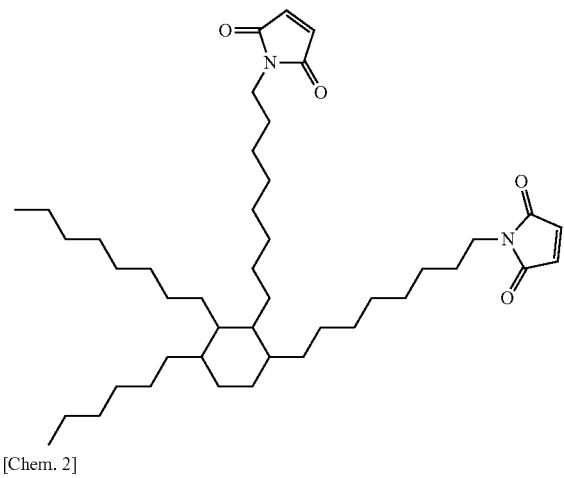

(1)

[Chem. 2]

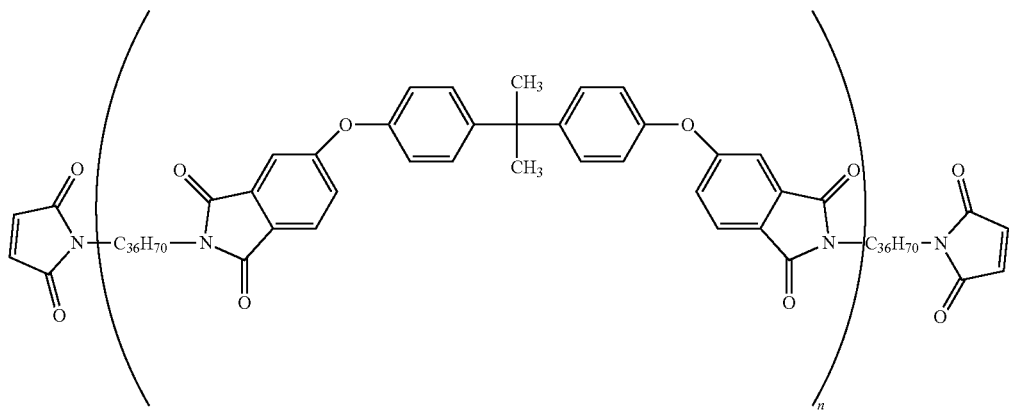

(2)

In the formula (2), n is 1 or greater and 10 or smaller.

[Chem. 3]

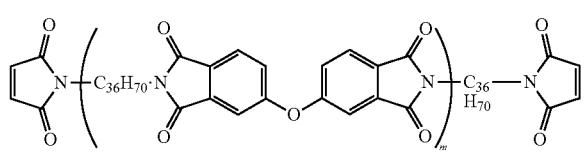

(3)

In the formula (3), m is 1 or greater and 2 or smaller.

The compound having an unsaturated double bond may be a non-crosslinkable monomer or a crosslinkable monomer.

Examples of the non-crosslinkable monomer include styrene monomers, N-alkyl group-substituted maleimide monomers, N-aryl group-substituted maleimide monomers, N-acyl group-substituted maleimide monomers, other non-crosslinkable maleimide monomers, carboxy group-containing monomers, alkyl (meth)acrylates, oxygen atom-containing (meth)acrylates, nitrile-containing monomers, acid vinyl ester compounds, unsaturated hydrocarbons, and halogen-containing monomers.

Examples of the styrene monomers include styrene and α-methylstyrene.

Examples of the N-alkyl group-substituted maleimide monomers include N-methylmaleimide, N-ethylmaleimide, and N-benzylmaleimide.

Examples of the N-aryl group-substituted maleimide monomers include N-ethylmaleimide, N-(4-aminophenyl)maleimide, and N-(9-acridinyl)maleimide.

Examples of the N-acyl group-substituted maleimide monomers include N-methoxycarbonylmaleimide.

Examples of other non-crosslinkable maleimide monomers include succinimidyl-4-(N-maleimidemethyl)cyclohexane-1-carboxylate and N-succinimidyl-3-maleimidopropionate.

Examples of the carboxy group-containing monomer include (meth)acrylic acid, maleic acid, and maleic anhydride.

Examples of the alkyl (meth)acrylates include methyl (meth)acrylate, ethyl (meth)acrylate, propyl (meth)acrylate, butyl (meth)acrylate, 2-ethylhexyl (meth)acrylate, lauryl (meth)acrylate, cetyl (meth)acrylate, stearyl (meth)acrylate, cyclohexyl (meth)acrylate, and isobornyl (meth)acrylate.

Examples of the oxygen atom-containing (meth)acrylates include 2-hydroxyethyl (meth)acrylate, glycerol (meth)acrylate, polyoxyethylene (meth)acrylate, and glycidyl (meth)acrylate.

Examples of the nitrile-containing monomers include (meth) acrylonitrile.

Examples of the acid vinyl ester compounds include vinyl acetate, vinyl butyrate, vinyl laurate, and vinyl stearate.

Examples of the unsaturated hydrocarbons include ethylene, propylene, isoprene, and butadiene.

Examples of the halogen-containing monomers include trifluoromethyl (meth)acrylate, pentafluoroethyl (meth) acrylate, vinyl chloride, vinyl fluoride, and chlorostyrene.

Examples of the crosslinkable monomers include polyfunctional (meth)acrylates and silane-containing monomers.

Examples of the polyfunctional (meth)acrylates include tetramethylolmethane tetra(meth)acrylate, tetramethylolmethane tri(meth)acrylate, tetramethylolmethane di(meth) acrylate, trimethylolpropane tri(meth)acrylate, dipentaerythritol hexa(meth)acrylate, dipentaerythritol penta(meth) acrylate, glycerol tri(meth)acrylate, glycerol di(meth) acrylate, (poly)ethylene glycol di(meth)acrylate, (poly) propylene glycol di(meth)acrylate, (poly)tetramethylene glycol di(meth)acrylate, and 1,4-butanediol di(meth)acrylate.

Examples of the silane-containing monomers include triallyl (iso)cyanurate, triallyl trimellitate, divinylbenzene, diallyl phthalate, diallyl acrylamide, diallyl ether, γ-(meth) acryloxypropyltrimethoxysilane, trimethoxysilylstyrene, and vinyltrimethoxysilane.

When the resin particles of the present invention have the bismaleimide-derived segment, the lower limit of the proportion of the bismaleimide-derived segment contained in the resin particles is preferably 0.1 mol %. When the proportion of the bismaleimide-derived segment is 0.1 mol % or more, the 5% weight loss temperature, the 10% K value at 25° C., and the 30% K value at 25° C. can be more easily adjusted to the above ranges. The lower limit of the proportion of the bismaleimide-derived segment is more preferably 3.0 mol %, still more preferably 9.0 mol %, particularly preferably 20 mol %.

In particular, the 5% weight loss temperature can be easily adjusted by adjusting the proportion of the bismaleimide-derived segment contained in the resin particles. The 5% weight loss temperature can be increased by increasing the proportion of the bismaleimide-derived segment, and can be decreased by decreasing the proportion of the bismaleimide-derived segment. The 10% K value at 25° C. and the 30% K value at 25° C. can be decreased by increasing the proportion of the bismaleimide-derived segment, and can be increased by decreasing the proportion of the bismaleimide-derived segment.

When the resin particles of the present invention have an imide group, the lower limit of the imide group content is preferably 0.01%, and the upper limit thereof is preferably 80%. An imide group content of 0.01% or more allows the polymer particles to have a more heat-resistant backbone. An imide group content of 80% or less makes it easier to adjust the 10% K value at 25° C. and the 30% K value at 25° C. to the above ranges. The lower limit of the imide group content is more preferably 5%, still more preferably 7.5%, and the upper limit thereof is more preferably 50%.

In particular, the 5% weight loss temperature can also be easily adjusted by adjusting the imide group content of the resin particles. The 5% weight loss temperature can be increased by increasing the imide group content, and can be decreased by decreasing the imide group content.

The imide group content can be determined using the following equation.

Imide group content (%)=$C/D \times 100$

In the equation, C is the total molecular weight of imide group portions contained in a repeating unit, and D is the total molecular weight of a repeating structural unit of the resin constituting the resin particles.

When the resin particles of the present invention are copolymer particles, the total molecular weight calculated by calculating the mole fraction of each repeating structural unit is used as D. For example, in Example 2 (described later), the structural unit of a compound represented by the formula (1) has a mole fraction of 0.5 and the structural unit of styrene has a mole fraction of 0.5. In this case, D is calculated as follows.

$D$=Molecular weight of compound represented by formula (1)×mole fraction+molecular weight of styrene×mole fraction=689×0.5+104.15× 0.5=396.575

The resin particles of the present invention may specifically be produced by, for example, a conventionally known polymerization method such as the suspension polymerization method, the emulsion polymerization method, the seeded polymerization method, and the dispersion polymerization. In particular, the suspension polymerization method and the emulsion polymerization method are suitable for producing fine particles of various types with various particle sizes because these methods can provide polydisperse polymer particles with a relatively broad particle size distribution. With the suspension polymerization method and the emulsion polymerization method, polymer particles obtained by polymerization are preferably classified to select polymer particles having a desired particle size or particle size distribution.

The present invention also encompasses conductive particles including the resin particles of the present invention and a conductive layer formed on a surface of each of the resin particles.

Examples of materials constituting the conductive layer include gold, silver, palladium, copper, platinum, zinc, iron, tin, lead, aluminum, cobalt, indium, nickel, chromium, titanium, antimony, bismuth, thallium, germanium, cadmium, silicon, tungsten, molybdenum, and alloys thereof, and tin-doped indium oxide (ITO). Preferred among these are tin-containing alloys, nickel, palladium, gold, copper, or silver because these can further decrease the connection resistance between electrodes. More preferred are tin-containing alloys, nickel, palladium, gold, or copper. Still more preferred is nickel or palladium.

The conductive layer can be formed on the resin particles by, for example, a method such as electroless plating, electroplating, physical evaporation, or coating the surface of the resin particles with metal powder or with a paste containing metal powder and a binder resin. The conductive layer is preferably formed by electroless plating because with this method the conductive layer can be easily formed. Examples of the physical evaporation include vacuum evaporation, ion plating, and ion sputtering.

The conductive particles of the present invention preferably have an insulating material on an outer surface of the conductive layer. The presence of an insulating material on the outer surface of the conductive layer can further prevent short circuits between adjacent electrodes when the resulting conductive particles are used to connect electrodes. Specifically, when multiple conductive particles make contact with each other, the insulating material present between multiple electrodes can prevent short circuits between horizontally adjacent electrodes, not between the upper and lower electrodes. Here, compressing the conductive particles with two electrodes in connecting the electrodes can easily remove the insulating material between the conductive layers of the conductive particles and the electrodes. The insulating material between the conductive layers of the conductive particles and the electrodes can be more easily removed when the conductive particles have multiple protrusions on the outer surface of the conductive layer.

To more easily remove the insulating material upon compression bonding of electrodes, the insulating material is preferably an insulating particle.

Examples of the insulating material include polyolefin compounds, (meth)acrylate polymers, (meth)acrylate copolymers, block polymers, thermoplastic resins, crosslinked products of thermoplastic resins, thermosetting resins, and water-soluble resins. The insulating materials may be used alone or in combination of two or more thereof.

Examples of the polyolefin compounds include polyethylene, ethylene-vinyl acetate copolymers, and ethylene-acrylate copolymers.

Examples of the (meth)acrylate polymers include polymethyl (meth)acrylate, polydodecyl (meth)acrylate, and polystearyl (meth)acrylate.

Examples of the block polymers include polystyrene, styrene-acrylate copolymers, SB-type styrene-butadiene block copolymers, SBS-type styrene-butadiene block copolymers, and hydrogenated products of these.

Examples of the thermoplastic resins include vinyl polymers and vinyl copolymers.

Examples of the thermosetting resins include epoxy resins, phenolic resins, and melamine resins.

Examples of the crosslinked products of thermoplastic resins include those obtained by introducing polyethylene glycol methacrylate, alkoxylated trimethylolpropane methacrylate, or alkoxylated pentaerythritol methacrylate to the thermoplastic resins.

Examples of the water-soluble resins include polyvinyl alcohol, polyacrylic acid, polyacrylamide, polyvinylpyrrolidone, polyethylene oxide, and methylcellulose.

During the production of the insulating material, a chain transfer agent may be used to adjust the degree of polymerization.

Examples of the chain transfer agent include thiol and carbon tetrachloride.

The insulating material may be disposed on the outer surface of the conductive layer by, for example, a method such as a chemical method, a physical method, or a mechanical method.

Examples of the chemical method include the interfacial polymerization method, the method of suspension polymerization in the presence of the particles, and the emulsion polymerization method.

Examples of the physical or mechanical method include methods such as spray drying, hybridization, electrostatic adhesion, spraying, dipping, and vacuum evaporation.

Preferred among these is a method of disposing the insulating material on the outer surface of the conductive layer through a chemical bond because the insulating material disposed by this method is less likely to be detached.

The outer surface of the conductive layer and the surface of the insulating material each may be coated with a compound having a reactive functional group. The outer surface of the conductive layer and the surface of the insulating material may not be directly chemically bonded to each other, but may be indirectly chemically bonded to each other through the compound having a reactive functional group. For example, after introducing a carboxy group onto the outer surface of the conductive layer, the carboxy group may chemically bond with the functional group on the surface of the insulating material through a polymer electrolyte such as polyethyleneimine.

The conductive particles of the present invention preferably have a protrusion on the outer surface of the conductive layer. The presence of a protrusion on the outer surface of the conductive layer allows the resulting conductive particles to further increase the continuity reliability between electrodes. The electrodes to be connected using the conductive particles often have an oxide film on their surfaces. The conductive particles also often have an oxide film on the conductive layer. Use of the conductive particles having a protrusion allows the oxide films to be effectively removed by the protrusion upon compression bonding after the conductive particles are disposed between the electrodes. This enables a more reliable contact of the electrodes and the conductive particles, thus more effectively reducing the connection resistance between the electrodes. Furthermore, when the conductive particles have the insulating material on the surface, or when the conductive particles are dispersed in a binder resin and used as a conductive material, the protrusion of the conductive particles effectively removes the insulating material and binder resin between the conductive particles and the electrodes. This can more effectively increase the continuity reliability between the electrodes.

The protrusion on the outer surface of the conductive layer can be formed by, for example, a method of embedding a core substance in the conductive layer. Embedding the core substance in the conductive layer makes it easy to form multiple protrusions on the outer surface of the conductive layer. Here, the core substance is not necessarily used to form the protrusion on the outer surface of the conductive layer of the conductive particles.

Specific examples of the method of forming the protrusion include: a method including attaching a core substance to the surface of the resin particles and then forming a conductive layer by electroless plating; and a method including forming a conductive layer on the surface of the resin particles by electroless plating, then attaching a core substance, followed by further forming a conductive layer by electroless plating. Other methods include, for example: a method including forming a first conductive layer on the surface of the resin particles, then disposing the core substance on the first conductive layer, and subsequently forming a second conductive layer; and a method including adding a core substance in the course of forming a conductive layer (e.g., a first conductive layer or a second conductive layer) on the surface of the resin particles. Alternatively, the protrusion may be formed without the core substance; for example, a method may be used that includes forming a conductive layer on the resin particles by electroless plating, then depositing plating in the shape of the protrusion on the surface of the conductive layer, and further forming a conductive layer by electroless plating.

Examples of the method of attaching the core substance to the surface of the resin particles include: a method including adding the core substance to a dispersion of the resin particles to accumulate and attach the core substance onto the surface of the resin particles by van der Waals forces; and a method including adding the core substance into a container containing the resin particles, and attaching the core substance to the surface of the resin particles by mechanical action such as rotation of the container. Preferred among these is a method including accumulating and attaching the core substance onto the surface of the resin particles in a dispersion, because with this method the amount of the core substance attached can be easily controlled.

The core substance may be made of a conductive substance or a nonconductive substance.

Examples of the conductive substance include metals, metal oxides, conductive nonmetals such as graphite, and conductive polymers.

Examples of the conductive polymers include polyacetylene.

Examples of the nonconductive substance include silica, alumina, titanium oxide, barium titanate, and zirconia.

In particular, the core substance is preferably made of a metal because it can increase conductivity and also effectively decrease connection resistance. The core substance is preferably a metal particle. The metal of which the core substance is made may appropriately be any of the metals mentioned as the materials to constitute the conductive layer.

The present invention also encompasses a conductive material containing the conductive particles of the present invention and a binder resin.

The binder resin used is an insulating resin. Examples thereof include vinyl resins, thermoplastic resins, curable resins, thermoplastic block copolymers, and elastomers. The binder resins may be used alone or in combination of two or more thereof.

Examples of the vinyl resins include vinyl acetate resins, acrylic resins, and styrene resins.

Examples of the thermoplastic resins include polyolefin resins, ethylene-vinyl acetate copolymers, and polyamide resins.

Examples of the curable resins include epoxy resins, urethane resins, polyimide resins, and unsaturated polyester resins. The curable resins may be room-temperature-curable resins, heat-curable resins, photocurable resins, or moisture-curable resins. The curable resins may be used in combination with curing agents.

Examples of the thermoplastic block copolymers include styrene-butadiene-styrene block copolymers, styrene-isoprene-styrene block copolymers, hydrogenated products of styrene-butadiene-styrene block copolymers, and hydrogenated products of styrene-isoprene-styrene block copolymers.

Examples of the elastomers include styrene-butadiene copolymer rubber and acrylonitrile-styrene block copolymer rubber.

The conductive material of the present invention may contain, in addition to the conductive particles and the binder resin, various additives such as fillers, extenders, softeners, plasticizers, polymerization catalysts, curing catalysts, colorants, antioxidants, thermal stabilizers, light stabilizers, ultraviolet absorbers, lubricants, antistatic agents, and flame retardants.

In the conductive material of the present invention, the conductive particles of the present invention are preferably dispersed in the binder resin.

The conductive particles may be dispersed in the binder resin by a conventionally known dispersion method. Specific examples include: a method including adding the conductive particles into the binder resin and then kneading them in a planetary mixer or the like; a method including uniformly dispersing the conductive particles in water or an organic solvent using a homogenizer or the like, adding the dispersion into the binder resin, and kneading them in a planetary mixer or the like; and a method including diluting the binder resin in water or an organic solvent or the like, then adding the conductive particles, and kneading them in a planetary mixer or the like.

The conductive material of the present invention may be used as an anisotropic conductive paste, an anisotropic conductive ink, an anisotropic conductive adhesive, an anisotropic conductive film, or an anisotropic conductive sheet, for example. When the conductive material of the present invention is used as a film-form adhesive such as an anisotropic conductive film or an anisotropic conductive sheet, a film-form adhesive not containing conductive particles may be stacked on the film-form adhesive containing the conductive particles.

The lower limit of the amount of the binder resin in 100 parts by weight of the conductive material of the present invention is preferably 10 parts by weight, and the upper limit thereof is preferably 99.99 parts by weight. The binder resin contained in an amount in the range allows the conductive particles to be efficiently disposed between electrodes, thus further increasing the connection reliability of the connection target members connected with the conductive material of the present invention. The lower limit of the amount of the binder resin is more preferably 30 parts by weight, still more preferably 50 parts by weight, particularly preferably 70 parts by weight. The upper limit thereof is more preferably 99.9 parts by weight.

The lower limit of the amount of the conductive particles in 100 parts by weight of the conductive material of the present invention is preferably 0.01 parts by weight, and the upper limit thereof is preferably 80 parts by weight. The conductive particles contained in an amount in the range can reduce deterioration of properties such as coating properties while further exhibiting their effects such as the conductivity-improving effect. The lower limit of the amount of the conductive particles is more preferably 0.1 parts by weight, and the upper limit thereof is more preferably 10 parts by weight.

The conductive material of the present invention may include various additives such as fillers, extenders, softeners, plasticizers, polymerization catalysts, curing catalysts, colorants, antioxidants, thermal stabilizers, light stabilizers, ultraviolet absorbers, lubricants, antistatic agents, and flame retardants, as long as they do not impair the purposes of the present invention.

The use of the conductive particles of the present invention enables the production of a connection structure having excellent connection reliability.

The present invention also encompasses a connection structure including a first connection target member that has a first electrode on a surface thereof, a second connection target member that has a second electrode on a surface thereof, and a connecting portion connecting the first connection target member and the second connection target member, the connecting portion including, as a constituting material, the conductive particles of the present invention or the conductive material of the present invention.

The resin particles of the present invention show a high degree of compressive deformation at the initial compression, can maintain a constant gap, and can reduce damage to circuit boards or substrates. The resin particles thus can also be suitably used as spacers for liquid crystal display elements, for example.

Advantageous Effects of Invention

The present invention can provide resin particles that have excellent heat resistance and that, when used as base particles of conductive particles, are applicable to mounting by thermocompression bonding at low pressure to produce a connection structure having excellent connection reliability. The present invention also can provide conductive particles, a conductive material, and a connection structure each including the resin particles.

DESCRIPTION OF EMBODIMENTS

The present invention is hereinafter described in more detail with reference to examples; however, the present invention should not be limited to these examples.

Example 1

In a reaction vessel equipped with a thermometer and a condenser, 4.6 parts by weight of a compound represented by the formula (1) (produced by Designer Molecules Inc., "BMI-689") and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 1.

Example 2

In a reaction vessel equipped with a thermometer and a condenser, 4.0 parts by weight of a compound represented by the formula (1) (produced by Designer Molecules Inc., "BMI-689"), 0.6 parts by weight of styrene, and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 2.

Example 3

In a reaction vessel equipped with a thermometer and a condenser, 3.5 parts by weight of a compound represented by the formula (1) (produced by Designer Molecules Inc., "BMI-689"), 1.1 parts by weight of styrene, and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 3.

Example 4

In a reaction vessel equipped with a thermometer and a condenser, 2.8 parts by weight of a compound represented by the formula (1) (produced by Designer Molecules Inc., "BMI-689"), 0.5 parts by weight of ethylmaleimide, 1.3 parts by weight of styrene, and 0.2 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 4.

Example 5

In a reaction vessel equipped with a thermometer and a condenser, 1.8 parts by weight of a compound represented by the formula (1) (produced by Designer Molecules Inc., "BMI-689"), 1.3 parts by weight of ethylmaleimide, 1.6 parts by weight of styrene, and 0.2 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 5.

Example 6

In a reaction vessel equipped with a thermometer and a condenser, 0.7 parts by weight of a compound represented by the formula (1) (produced by Designer Molecules Inc., "BMI-689"), 2.0 parts by weight of ethylmaleimide, 1.9 parts by weight of styrene, and 0.2 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 6.

Example 7

In a reaction vessel equipped with a thermometer and a condenser, 0.3 parts by weight of a compound represented by the formula (1) (produced by Designer Molecules Inc., "BMI-689"), 2.4 parts by weight of ethylmaleimide, 2.0 parts by weight of styrene, and 0.2 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 7.

Example 8

In a reaction vessel equipped with a thermometer and a condenser, 4.6 parts by weight of a compound represented by the formula (2) (produced by Designer Molecules Inc., "BMI-1400") and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 8.

Example 9

In a reaction vessel equipped with a thermometer and a condenser, 4.1 parts by weight of a compound represented by the formula (2) (produced by Designer Molecules Inc., "BMI-1400"), 0.5 parts by weight of styrene, and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 9.

Example 10

In a reaction vessel equipped with a thermometer and a condenser, 4.6 parts by weight of a compound represented by the formula (3) (produced by Designer Molecules Inc., "BMI-1500") and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 10.

Example 11

In a reaction vessel equipped with a thermometer and a condenser, 4.0 parts by weight of a compound represented by the formula (3) (produced by Designer Molecules Inc., "BMI-1500"), 0.6 parts by weight of styrene, and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 11.

Example 12

In a reaction vessel equipped with a thermometer and a condenser, 3.9 parts by weight of a compound represented by the formula (1) (produced by Designer Molecules Inc., "BMI-689"), 0.5 parts by weight of divinylbenzene, 0.2 parts by weight of styrene, and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 12.

Example 13

In a reaction vessel equipped with a thermometer and a condenser, 3.9 parts by weight of a compound represented by the formula (1) (produced by Designer Molecules Inc., "BMI-689"), 0.7 parts by weight of divinylbenzene, and 0.3 parts by weight of 2,2'-azobis(isobutyronitrile) as a polymerization initiator were dissolved in 4.6 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 13.

Example 14

In a reaction vessel equipped with a thermometer and a condenser, 2.4 parts by weight of ethylmaleimide, 2.0 parts by weight of styrene, and 0.3 parts by weight of 2,2'-azobis(isobutyronitrile) as a polymerization initiator were mixed with 4.4 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 14.

Example 15

In a reaction vessel equipped with a thermometer and a condenser, 4.6 parts by weight of a compound represented by the formula (1) (produced by Designer Molecules Inc., "BMI-689") and 0.3 parts by weight of 2,2'-azobis(isobutyronitrile) as a polymerization initiator were mixed with 3.0 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 15.

Example 16

In a reaction vessel equipped with a thermometer and a condenser, 4.0 parts by weight of a compound represented by the formula (1) (produced by Designer Molecules Inc., "BMI-689"), 0.6 parts by weight of styrene and 0.3 parts by weight of 2,2'-azobis(isobutyronitrile) as a polymerization initiator were dissolved in 2.0 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 16.

Comparative Example 1

Polyimide P84 NT (produced by Daicel-Evonik Ltd.) was used as resin particles 17.

Comparative Example 2

Divinylbenzene copolymer resin particles (produced by Sekisui Chemical Co., Ltd., "Micropearl") were used as resin particles 18.

Comparative Example 3

In a reaction vessel equipped with a thermometer and a condenser, 4.4 parts by weight of Light Acrylate MPD-A (produced by Kyoeisha Chemical Co., Ltd.), 0.2 parts by weight of A-TMMT (produced by Shin-Nakamura Chemical Co., Ltd.), and 0.3 parts by weight of 2,2'-azobis(isobutyronitrile) as a polymerization initiator were dissolved in 2.0 parts by weight of toluene. To the obtained solution were added 13.1 parts by weight of a 5.5% by weight aqueous polyvinyl alcohol solution (produced by The Nippon Synthetic Chemical Industry Co., Ltd., "GOHSENOL GH-20") and 0.4 parts by weight of sodium dodecylbenzenesulfonate as dispersion stabilizers and 180 parts by weight of ultrapure water, followed by stirring with a high-speed homogenizer (produced by Central Scientific Commerce, Inc., "POLYTRON PT-3100") to give a suspension. The obtained suspension was warmed to 65° C. and stirred under heat for 24 hours to give resin particles 19.

Comparative Example 4

In accordance with Non-Patent Literature 1, resin particles were prepared as follows.

In a reaction vessel equipped with a thermometer, a stirrer, and a condenser, 0.1 mol of 3,3',4,4'-benzophenonetetracarboxylic dianhydride, 0.05 mol of 1,4-bis(4-aminophenoxy)benzene, and 0.05 mol of bis[4-(3-aminophenoxy)phenyl]sulfone were dissolved in 500 mL of N,N-dimethylformamide. The obtained solution was stirred at 25° C. for 24 hours to give a solution of polyamic acid, the prepolymer of polyimide. To the obtained solution was added 100 mL of toluene. The solution was refluxed under heat in a nitrogen atmosphere for four hours to give resin particles 20.

(5% Thermal Weight Loss Temperature)

The resin particles obtained in the examples and the comparative examples were weighed (10 mg) in aluminum pans. Thermogravimetric analysis was performed using a thermogravimetry-differential thermal analyzer in a nitrogen atmosphere under the heating conditions of a heating rate of 5° C./min from 35° C. to 1,000° C. The temperature at which the weight loss reached 5% was determined. Tables 1 and 2 show the results.

The thermogravimetry-differential thermal analyzer used was TG/DTA6300 (produced by Hitachi High-Tech Science Corporation).

(10% K Value and 30% K Value)

The resin particles obtained in Examples 1 to 16 and Comparative Examples 2 and 3 were compressed with a flat-end, cylindrical diamond indenter with a diameter of 50 μm under the conditions of 25° C., a compression rate 0.3 mN/sec, and a maximum test load of 10 mN using a compression tester. The compression displacement (μm) was measured, and the 10% K value and the 30% K value were determined by the above equation. Tables 1 and 2 show the results.

The compression tester used was FISCHERSCOPE H-100 (produced by Fischer Instruments K.K.).

(Coefficient of Variation of Aspect Ratio and Average Particle Size)

Images of the resin particles obtained in the examples and the comparative examples were captured with a scanning electron microscope. The major and minor axes of 50 particles in the obtained images were each measured with a caliper to determine the aspect ratio. From the standard deviation and the average of the aspect ratio, the coefficient of variation of the aspect ratio was determined by the above equation. The average minor axis of the 50 particles in the obtained images was determined as the average particle size. Tables 1 and 2 show the results.

The scanning electron microscope used was Regulus-8220 (produced by Hitachi High-Technologies Corporation).

(Coefficient of Variation of Particle Size)

The standard deviation and the average of the particle size of the resin particles obtained in the examples and the comparative examples were determined using a laser diffraction scattering-type particle size distribution analyzer. The coefficient of variation of the particle size was determined by the above equation. Tables 1 and 2 show the results.

The particle size distribution analyzer used was LS 13 320 (wet system) (produced by Beckman Coulter, Inc).

(Change in 30% K Value Before and After Heating)

The resin particles obtained in Examples 1 to 16 and Comparative Examples 2 to 4 were heated at 200° C. for 24 hours. From the measurements of the 30% K value at 25° C. before and after heating, the change in the 30% K value before and after heating was determined by the above equation. Tables 1 and 2 show the results.

(Recovery Rate)

The resin particles obtained in Examples 1 to 16 and Comparative Examples 2 to 4 were loaded with a smooth end of a 50-μm-diameter diamond cylinder under the conditions of 25° C., a compression rate of 0.3 mN/sec, an initial load of 1.0 mN, and a reverse load of 10 mN using a compression tester. The recovery behavior after unloading was analyzed, and the recovery rate was determined by the method described above. Tables 1 and 2 show the results.

The compression tester used was FISCHERSCOPE H-100 (produced by Fischer Instruments K.K.).

(Imide Group Content)

The imide group content of the resin particles obtained in Examples 1 to 16 and Comparative Examples 2 to 4 was determined by the above equation. Tables 1 and 2 show the results.

<Evaluation>

The resin particles obtained in the examples and the comparative examples were evaluated as follows. Tables 1 and 2 show the results.

(1) Long-Term Connection Reliability Under High-Temperature Conditions (1-1) Preparation of Conductive Particles The resin particles (10 parts by weight) obtained in each of the examples and the comparative examples were dispersed, using an ultrasonic disperser, in 100 parts by weight of an alkali solution containing a palladium catalyst solution in an amount of 5% by weight. The solution was then filtrated to recover the resin particles. Subsequently, the resin particles were added to 100 parts by weight of a 1% by weight dimethylamine borane solution to activate the surface of the resin particles. The surface-activated resin particles were sufficiently washed with water and then dispersed in 500 parts by weight of distilled water to give a dispersion. To the dispersion was then added 1 g of a nickel particle slurry (average particle size 100 nm) over three minutes to give a suspension containing resin particles with a core substance attached thereto. Separately, a nickel-plating liquid (pH 8.5) was prepared that contained 0.35 mol/L of nickel sulfate, 1.38 mol/L of dimethylamine borane, and 0.5 mol/L of sodium citrate. While stirring the obtained suspension at 60° C., the nickel-plating liquid was gradually dripped into the suspension to perform electroless nickel plating. Thereafter, the suspension was filtrated to recover the particles, which were washed with water and dried to give conductive particles having a nickel-boron conductive layer (thickness 0.15 μm) on the surface of the resin particles.

(1-2) Preparation of Insulating Particles

In a separable flask, a monomer composition containing 100 mmol of methyl methacrylate, 1 mmol of N,N,N-trimethyl-N-2-methacryloyloxyethyl ammonium chloride, and 1 mmol of 2,2'-azobis(2-amidinopropane)dihydrochloride was weighed out into ion-exchanged water to a solid content of 5% by weight. The separable flask had a capacity of 1,000 mL and was equipped with a four-necked separable cover, a stirring blade, a three-way cock, a condenser, and a temperature probe. They were stirred at 200 rpm, and polymerization was performed in a nitrogen atmosphere at 70° C. for 24 hours. After the termination of the reaction, the obtained product was freeze-dried to give insulating particles that had an ammonium group on the surface and had an average particle size of 220 nm and a particle size CV value of 10%.

(1-3) Preparation of Conductive Particles with Insulating Particles

The insulating particles obtained in "(1-2) Preparation of insulating particles" were ultrasonically dispersed in distilled water to give a 10% by weight aqueous dispersion of the insulating particles. Subsequently, 10 g of the conductive particles obtained in "(1-1) Preparation of conductive particles" were dispersed in 500 mL of distilled water, and 1 g of the 10% by weight aqueous dispersion of the insulating particles was added, followed by stirring at room temperature for eight hours. After filtration with a 3-μm mesh filter, the particles were washed with methanol and dried to give conductive particles with insulating particles.

(1-4) Preparation of Conductive Material (Anisotropic Conductive Paste)

An amount of 7 parts by weight of the obtained conductive particles with insulating particles, 25 parts by weight of a bisphenol A phenoxy resin, 4 parts by weight of a fluorene epoxy resin, 30 parts by weight of a phenol novolac epoxy resin, and SI-60L (produced by Sanshin Chemical Industry Co., Ltd.) were mixed. The mixture was deaerated and stirred for three minutes to give a conductive material (anisotropic conductive paste).

(1-5) Preparation of Connection Structure

A transparent glass substrate was provided that had on its upper surface an aluminum electrode pattern (first electrode) having a height of 0.2 μm and a L/S of 10 μm/10 μm (first connection target member). A two-layer flexible circuit board was also provided that had on its lower surface an aluminum electrode pattern (second electrode) having a L/S of 10 μm/10 μm (second connection target member). The obtained anisotropic conductive paste was applied to the transparent glass substrate to a thickness of 15 μm to form an anisotropic conductive paste layer. Subsequently, the two-layer flexible circuit board was stacked on the anisotropic conductive paste layer, with the electrodes facing each other. Thereafter, a compressing and heating head was placed on the top surface of the semiconductor chip while adjusting the head temperature such that the temperature of the anisotropic conductive paste layer was 180° C. A pressure of 1 MPa was applied to cure the anisotropic conductive paste layer at 180° C., whereby a connection structure was obtained.

(1-6) Evaluation of Long-Term Connection Reliability Under High-Temperature Conditions A hundred connection structures obtained in the above manner were left to stand at 200° C. for 24 hours. The 100 connection structures after standing were examined for continuity failure between the upper and lower electrodes.

The long-term connection reliability under high-temperature conditions were evaluated as follows. "ooo" (excellent): not more than one connection structure had continuity failure; "oo" (very good): two or more but not more than five connection structures had continuity failure; "o" (good): 6 or more but not more than 10 connection structures had continuity failure; "x" (bad): 11 or more connection structures had continuity failure.

(2) Adhesion of Resin Particle and Conductive Portion

The conductive particles in the connecting portion of a connection structure obtained in the same manner as in "(1) Evaluation of long-term connection reliability under high-temperature conditions" were observed with a scanning electron microscope (produced by Hitachi High-Technologies Corporation, "Regulus 8220"). A hundred observed conductive particles were examined to determine if the conductive portion (conductive layer) disposed on the surface of the resin particle had peeled off.

The adhesion of the resin particle and the conductive portion was evaluated as follows. "ooo" (excellent): the conductive portion had peeled off in no (zero) conductive particle; "oo" (very good): the conductive portion had peeled off in more than 0 but not more than 15 conductive particles; "o" (good): the conductive portion had peeled off in more than 15 but not more than 30 conductive particles; "x" (bad): the conductive portion had peeled off in more than 30 but not more than 50 conductive particles; "xx" (very bad): the conductive portion had peeled off in more than 50 conductive particles.

(3) Insulation Reliability (Horizontal Direction)

A hundred connection structures obtained in the same manner as in "(1) Evaluation of long-term connection reliability under high-temperature conditions" were left to stand at 200° C. for 24 hours. The resistance of the 100 connection structures after standing was measured with a tester to determine the presence or absence of a leakage current between adjacent electrodes.

The insulation reliability (horizontal direction) was evaluated as follows. "ooo" (excellent): 100 connection structures had a resistance of $10^8\Omega$ or higher; "oo" (very good): 90 or more but not fewer than 100 connection structures had a resistance of $10^8\Omega$ or higher; "o" (good): 80 or more but fewer than 90 connection structures had a resistance of $10^8\Omega$ or higher; "x" (bad): 70 or more but fewer than 80 connection structures had a resistance of $10^8\Omega$ or higher; "xx" (very bad): fewer than 70 connection structures had a resistance of $10^8\Omega$ or higher.

| | | Example | | | | | | | | | | | | | | | |
|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 |
| | | Resin particles 1 | Resin particles 2 | Resin particles 3 | Resin particles 4 | Resin particles 5 | Resin particles 6 | Resin particles 7 | Resin particles 8 | Resin particles 9 | Resin particles 10 | Resin particles 11 | Resin particles 12 | Resin particles 13 | Resin particles 14 | Resin particles 15 | Resin particles 16 |
| | | | | | | | Resin particle type | | | | | | | | | | |
| Particle composition (mol %) | Compound represented by formula (1) | 100 | 50 | 33.3 | 20 | 9 | 3 | 1 | — | — | — | — | — | 50 | — | 100 | 50 |
| | Compound represented by formula (2) | — | — | — | — | — | — | — | 100 | 33.3 | — | — | — | — | — | — | — |
| | Compound represented by formula (3) | — | — | — | — | — | — | — | — | — | 100 | 33.3 | — | — | — | — | — |
| | Styrene | — | 50 | 66.7 | 60 | 50 | 50 | 50 | — | 66.7 | — | 66.7 | 17 | — | 50 | — | 50 |
| | Ethylmaleimide | — | — | — | 20 | 41 | 47 | 49 | — | — | — | — | — | — | 50 | — | — |
| | Divinyl benzene | — | — | — | — | — | — | — | — | — | — | — | 33 | 50 | — | — | — |
| | Polyimide | — | — | — | — | — | — | — | — | — | — | — | — | — | — | — | — |
| | Light Acrylate MPD-A | — | — | — | — | — | — | — | — | — | — | — | — | — | — | — | — |
| | A-TMMT | — | — | — | — | — | — | — | — | — | — | — | — | — | — | — | — |
| | 5% Thermal weight loss temperature (°C) | 398 | 380 | 388 | 393 | 400 | 378 | 360 | 400 | 395 | 405 | 397 | 401 | 394 | 367 | 398 | 380 |
| | 10% K value (N/mm²) | 190 | 330 | 380 | 1030 | 1420 | 1860 | 1950 | 350 | 400 | 400 | 450 | 520 | 320 | 2290 | 190 | 330 |
| | 30% K value (N/mm²) | 170 | 240 | 240 | 400 | 550 | 690 | 900 | 240 | 240 | 200 | 210 | 330 | 260 | 720 | 170 | 240 |
| | Coefficient of variation of aspect ratio (%) | 0.9 | 1.2 | 2.3 | 2.5 | 1.5 | 1.4 | 1.2 | 1.3 | 1.0 | 1.0 | 1.2 | 1.7 | 2.0 | 1.0 | 3.2 | 5.5 |
| | Average particle size (μm) | 4.0 | 4.1 | 3.8 | 3.9 | 4.1 | 3.0 | 3.5 | 3.7 | 4.1 | 3.9 | 4.0 | 4.0 | 4.1 | 4.2 | 4.1 | 4.3 |
| | Coefficient of variation of particle size (%) | 10 | 10 | 10 | 10 | 10 | 10 | 11 | 10 | 10 | 9 | 10 | 10 | 10 | 10 | 9 | 10 |
| | Change in 30% K value before and after heating (%) | 123 | 110 | 96 | 52 | 30 | 20 | 15 | 140 | 80 | 120 | 70 | 90 | 80 | 20 | 132 | 110 |
| | Recovery rate (%) | 23 | 19 | 14 | 10 | 7.5 | 4.1 | 3.5 | 20 | 12 | 21 | 14 | 21 | 18 | 2.9 | 23 | 19 |
| | Imide group content (%) | 28 | 24 | 21 | 26 | 34 | 39 | 41 | 11 | 10 | 13 | 11 | 24 | 23 | 42 | 28 | 24 |
| Evaluation | Long-term connection reliability under high-temperature conditions | ⊙⊙⊙ | ⊙⊙⊙ | ⊙⊙⊙ | ⊙⊙⊙ | ⊙⊙⊙ | ⊙⊙ | ⊙⊙ | ⊙⊙⊙ | ⊙⊙⊙ | ⊙⊙⊙ | ⊙⊙⊙ | ⊙⊙⊙ | ⊙⊙⊙ | ○ | ○ | ○ |
| | Adhesion of resin particle and conductive portion | ⊙⊙⊙ | ⊙⊙⊙ | ⊙⊙⊙ | ⊙⊙⊙ | ⊙⊙⊙ | ⊙⊙ | ⊙⊙ | ⊙⊙⊙ | ⊙⊙⊙ | ⊙⊙⊙ | ⊙⊙⊙ | ⊙⊙⊙ | ⊙⊙⊙ | ○ | ○ | ○ |
| | Insulation reliability (horizontal direction) | ⊙⊙⊙ | ⊙⊙⊙ | ⊙⊙⊙ | ⊙⊙⊙ | ⊙⊙⊙ | ⊙⊙ | ⊙⊙ | ⊙⊙⊙ | ⊙⊙⊙ | ⊙⊙⊙ | ⊙⊙⊙ | ⊙⊙⊙ | ⊙⊙⊙ | ○ | ○ | ○ |

TABLE 2

|  |  | Comparative Example | | | |
|---|---|---|---|---|---|
|  |  | 1 | 2 | 3 | 4 |
|  | Resin particle type | Resin particles 17 | Resin particles 18 | Resin particles 19 | Resin particles 20 |
| Particle composition (mol %) | Compound represented by formula (1) | — | — | — | — |
|  | Compound represented by formula (2) | — | — | — | — |
|  | Compound represented by formula (3) | — | — | — | — |
|  | Styrene | — | — | — | — |
|  | Ethylmaleimide | — | — | — | — |
|  | Divinylbenzene | — | 100 | — | — |
|  | Polyimide | 100 | — | — | 100 |
|  | Light Acrylate MPD-A | — | — | 96 | — |
|  | A-TMMT | — | — | 4 | — |
|  | 5% Thermal weight loss temperature (° C.) | 179 | 385 | 350 | 210 |
|  | 10% K value (N/mm$^2$) | — | 4440 | 2400 | — |
|  | 30% K value (N/mm$^2$) | — | 3830 | 2000 | — |
|  | Coefficient of variation of aspect ratio (%) | 16 | 0.9 | 1.2 | 11 |
|  | Average particle size (μm) | 2.4 | 3 | 4.2 | 4.0 |
|  | Coefficient of variation of particle size (%) | 40 | 5 | 9 | 12 |
|  | Change in 30% K value before and after heating (%) | — | 10 | 90 | 30 |
|  | Recovery rate (%) | — | 51 | 55 | 3.8 |
|  | Imide group content (%) | — | 0 | 0 | 54 |
| Evaluation | Long-term connection reliability under high-temperature conditions | x | x | x | x |
|  | Adhesion of resin particle and conductive portion | x | ∘∘ | ∘∘ | ∘ |
|  | Insulation reliability (horizontal direction) | xx | ∘ | ∘ | x |

INDUSTRIAL APPLICABILITY

The present invention can provide resin particles that have excellent heat resistance and that, when used as base particles of conductive particles, are applicable to mounting by thermocompression bonding at low pressure to produce a connection structure having excellent connection reliability. The present invention can also provide conductive particles, a conductive material, and a connection structure each including the resin particles.

The invention claimed is:

1. Resin particles comprising a backbone containing an imide group, and having a 5% weight loss temperature of 350° C. or higher, a 10% K value at 25° C. of 100 N/mm$^2$ or more and 2,500 N/mm$^2$ or less, and a 30% K value at 25° C. of 100 N/mm$^2$ or more and 1,500 N/mm$^2$ or less,
wherein the resin particles have a coefficient of variation of an aspect ratio of 10% or less, and
the resin particles have a coefficient of variation of a particle size of 20% or less as determined by particle size distribution measurement.

2. The resin particles according to claim 1, having an average particle size of 0.1 μm or greater and 1,000 μm or smaller.

3. The resin particles according to claim 1,
wherein a change in the 30% K value before and after heating at 200° C. for 24 hours is 200% or less.

4. The resin particles according to claim 1, having a 10% K value at 25° C. of 100 N/mm$^2$ or more and 2,290 N/mm$^2$ or less.

5. The resin particles according to claim 1, having a 10% K value at 25° C. of 100 N/mm$^2$ or more and 2,000 N/mm$^2$ or less.

6. Conductive particles, comprising:
the resin particles according to claim 1; and
a conductive layer formed on a surface of each of the resin particles.

7. The conductive particles according to claim 6,
wherein an insulating material is provided on an outer surface of the conductive layer.

8. The conductive particles according to claim 6,
wherein a protrusion is provided on the outer surface of the conductive layer.

9. A conductive material comprising:
the conductive particles according to claim 6; and
a binder resin.

10. A connection structure comprising:
a first connection target member that has a first electrode on a surface thereof;
a second connection target member that has a second electrode on a surface thereof; and
a connecting portion connecting the first connection target member and the second connection target member,
the connecting portion including, as a constituting material, the conductive particles according to claim 6.

* * * * *